United States Patent
Battista et al.

(10) Patent No.: US 9,780,098 B2
(45) Date of Patent: Oct. 3, 2017

(54) INTEGRATED STRUCTURE COMPRISING NEIGHBORING TRANSISTORS

(71) Applicant: STMicroelectronics (Rousset) SAS, Rousset (FR)

(72) Inventors: Marc Battista, Marseilles (FR); François Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/229,709

(22) Filed: Aug. 5, 2016

(65) Prior Publication Data
US 2016/0343717 A1    Nov. 24, 2016

Related U.S. Application Data

(62) Division of application No. 14/657,963, filed on Mar. 13, 2015, now Pat. No. 9,431,108.

(30) Foreign Application Priority Data

Mar. 21, 2014   (FR) ..................... 14 52363

(51) Int. Cl.
| | |
|---|---|
| H01L 27/11 | (2006.01) |
| G11C 11/412 | (2006.01) |
| G11C 11/418 | (2006.01) |
| G11C 16/04 | (2006.01) |
| G11C 16/08 | (2006.01) |
| H01L 27/088 | (2006.01) |
| H01L 29/49 | (2006.01) |

(Continued)

(52) U.S. Cl.
CPC ........ *H01L 27/1104* (2013.01); *G11C 11/418* (2013.01); *G11C 11/4125* (2013.01); *G11C 14/0063* (2013.01); *G11C 16/045* (2013.01); *G11C 16/08* (2013.01); *H01L 21/823462* (2013.01); *H01L 27/088* (2013.01); *H01L 29/4916* (2013.01); *H01L 29/513* (2013.01)

(58) Field of Classification Search
None
See application file for complete search history.

(56) References Cited

U.S. PATENT DOCUMENTS

| | | |
|---|---|---|
| 4,132,904 A | 1/1979 | Harari |
| 4,132,905 A | 1/1979 | Stein |

(Continued)

FOREIGN PATENT DOCUMENTS

| | | |
|---|---|---|
| CN | 102129976 A | 7/2011 |
| CN | 102956264 A | 3/2013 |
| CN | 204885162 U | 12/2015 |

*Primary Examiner* — Long Pham
(74) *Attorney, Agent, or Firm* — Slater Matsil, LLP

(57) ABSTRACT

An integrated structure includes a first MOS transistor with a first controllable gate region overlying a first gate dielectric and a second MOS transistor neighboring the first MOS transistor and having a second controllable gate region overlying the first gate dielectric. A common conductive region overlies the first and second gate regions and is separated therefrom by a second gate dielectric. The common conductive region includes a continuous element located over a portion of the first and second gate regions and a branch extending downward from the continuous element toward the substrate as far as the first gate dielectric. The branch located between the first and second gate regions.

24 Claims, 9 Drawing Sheets

(51) Int. Cl.
*H01L 29/51* (2006.01)
*G11C 14/00* (2006.01)
*H01L 21/8234* (2006.01)

(56) References Cited

U.S. PATENT DOCUMENTS

| | | |
|---|---|---|
| 4,337,522 A | 6/1982 | Stewart |
| 4,417,325 A * | 11/1983 | Harari .................. G11C 11/405 |
| | | 257/263 |
| 4,467,451 A | 8/1984 | Moyer |
| 4,980,859 A | 12/1990 | Guterman et al. |
| 5,519,663 A | 5/1996 | Harper, Jr. et al. |
| 5,536,671 A | 7/1996 | Park |
| 6,097,618 A | 8/2000 | Jenne |
| 7,164,608 B2 | 1/2007 | Lee |
| 8,018,768 B2 | 9/2011 | Shih et al. |
| 8,331,150 B2 | 12/2012 | Hsu et al. |
| 2005/0161719 A1 | 7/2005 | Kondo et al. |
| 2006/0023503 A1 | 2/2006 | Lee |
| 2009/0190402 A1 * | 7/2009 | Hsu ....................... G11C 14/00 |
| | | 365/185.08 |
| 2011/0044109 A1 | 2/2011 | Shih et al. |
| 2013/0039127 A1 | 2/2013 | Wang |
| 2014/0369119 A1 | 12/2014 | Talliet et al. |
| 2014/0369120 A1 | 12/2014 | Tailliet et al. |
| 2015/0016188 A1 | 1/2015 | Talliet et al. |
| 2015/0270002 A1 | 9/2015 | Battista et al. |

* cited by examiner

INTEGRATED STRUCTURE COMPRISING NEIGHBORING TRANSISTORS

CROSS-REFERENCE TO RELATED APPLICATIONS

This application is a Divisional Application of U.S. application Ser. No. 14/657,963, filed on Mar. 13, 2015, which claims the benefit of French Application No. 1452363, filed on Mar. 21, 2014, which applications are hereby incorporated herein by reference.

TECHNICAL FIELD

Embodiments of the invention relate to circuits using MOS transistors that are neighboring or placed near each other, for example facing or substantially facing, and that have gate regions that are preferably aligned.

BACKGROUND

Such circuits may for example be circuits that repeat with a preset and constant pitch, such as the circuits that are used in memory devices, for example in row and/or column decoders, and especially memory devices associating, in a given memory cell, an SRAM (static random access memory) elementary memory cell and one or more, for example two or four, nonvolatile elementary memory cells, in particular double-gate EEPROM (electrically-erasable and programmable read-only memory) elementary memory cells.

Furthermore, for example, MOS transistors placed near one another may also be found in the inverters of SRAM elementary memory cells.

The distance between two neighboring MOS transistors is often constrained by lithography constraints that specify minimum distances between the two gate regions or even between the channels of the two transistors.

These drawbacks are also encountered when fabricating transistors in double gate level technologies, such as the technologies found in memory devices associating, in a given memory cell, an SRAM elementary cell and one or more nonvolatile elementary memory cells, for example double-gate EEPROM memory cells.

SRAM elementary memory cells are volatile memory cells, i.e., the data they store is lost if their power supply is cut but they may be accessed very rapidly and have an infinite cycling endurance.

Nonvolatile elementary memory cells, for example EEPROM memory cells, allow data to be preserved in the event of a power cut but cannot be cycled indefinitely.

A memory cell associating an SRAM elementary cell and one or more (for example, two or four) nonvolatile cells makes it possible to combine the advantages of the two approaches, namely the speed and the infinite endurance of the SRAM memory and the nonvolatility of the nonvolatile memory, flash or EEPROM memory for example.

Under normal operating conditions, data is written and read in such memory cells to/from the SRAM elementary cell. On the other hand, especially when power is cut, the content of the SRAM elementary cell is transferred to the nonvolatile elementary memory cell(s) that are associated therewith.

Then, especially when power returns, the data contained in the nonvolatile memory cells are reloaded into the corresponding SRAM elementary memory cell.

Examples of architectures of such memory cells associating SRAM memory and nonvolatile memory are described in the documents U.S. Pat. No. 4,132,905, U.S. Pat. No. 4,467,451, U.S. Pat. No. 4,980,859, U.S. Pat. No. 7,164,608 and U.S. Pat. No. 8,018,768 and in the French patent applications filed under the numbers 1355439 (corresponding to US 2014/0369120), 1355440 (corresponding to US 2014/0369119) and 1356720 (corresponding to US 2015/0016188).

When the one or more transistors of the nonvolatile elementary memory cell are one or more floating-gate transistors that thus comprise two polysilicon levels per example, all the transistors of the SRAM cell are advantageously produced in these two polysilicon levels.

Then, as regards the transistors of the SRAM cell, a short-circuit is then formed between the two polysilicon layers either via an electrical contact or by bringing them into physical contact by removing the gate dielectric located between the two polysilicon layers.

In conventional etching operations, the ends of the effective gates of the transistors, i.e., the gates formed in the first polysilicon layer, are rounded, thereby requiring the size of these gate regions to be increased in order to prevent these rounded portions from getting too close to the channel region, which could lead to leakage. Moreover, the definition of the geometry of the gate region gets worse as the thickness of the polysilicon stack to be etched increases. These defects are sometimes corrected by optical proximity corrections (OPCs) but in fine they generally do not allow structures to be obtained the gate regions of which have satisfactorily square edges.

SUMMARY

According to one embodiment of the invention, it is proposed to produce neighboring transistors having a notable decrease in the space between the two transistors while preventing problems with geometry rounding at certain ends of the etched gate regions.

According to another embodiment, it is proposed to use such a compact structure comprising adjacent transistors in a memory device, especially of the type associating SRAM elementary memory cells and non-volatile double-gate EEPROM elementary memory cells.

According to one aspect, provision is made for an integrated structure comprising a pair of neighboring, for example, facing or substantially facing, MOS transistors. Each transistor comprises a controllable gate region separated from an underlying substrate by a first gate dielectric, for example, silicon dioxide. An additional region comprises a gate material, for example, polysilicon. The region is separated from the two gate regions by a second gate dielectric, for example, a silicon nitride/silicon dioxide/silicon nitride stack.

This additional region possesses a continuous element located on top of a portion of the two gate regions and a branch united with a zone of the lower face of the element and extending between them and at distance from the two gate regions as far as the first gate dielectric.

Thus, a compact structure is obtained in which the space between the two transistors with controllable (i.e., non-floating) gates is decreased relative to a conventional prior art structure.

Even though it is not essential, it is preferable for the two gate regions of the two transistors to be aligned, for the sake of simplicity of implementation.

The orthogonal projections onto the substrate of the two facing profiles of the two gate regions are advantageously free from rounded portions, i.e., they have square edges.

In order to be able to control the gate regions of the two transistors, provision is made, according to one embodiment, for each gate region to project beyond the continuous element of the additional region, thereby, for example, allowing provision to be made for two electrically conductive contact pads, located on either side of the additional region, and making contact with the two gate regions, respectively.

Moreover, even though it is not essential, it is advantageous to provide an additional contact pad making contact with the additional region. This is because this optionally allows this additional region to be left floating or indeed to be connected to a potential, thereby especially allowing two parallel capacitors to be formed inexpensively, the capacitors being connected to the gates of the two MOS transistors, respectively, one of the electrodes of each capacitor being formed by the corresponding gate region.

Furthermore, as will be seen in more detail below, such an embodiment in particular has an advantageous application in SRAM elementary memory cells associated with nonvolatile elementary memory cells.

According to another aspect, provision is made for a memory device comprising a memory plane containing rows and columns of memory cells of the type comprising an SRAM elementary memory cell and at least one nonvolatile elementary memory cell that are coupled together, and a processor configured to manage the memory plane.

According to one general feature of this other aspect, the nonvolatile elementary memory cells each comprise at least one floating-gate transistor, and each SRAM elementary memory cell and/or the processor comprise at least one integrated structure such as defined above.

Thus, a memory device having a smaller footprint than conventional prior-art devices is obtained.

The SRAM elementary memory cell generally possesses two cross-coupled inverters. Furthermore, according to one embodiment, this elementary memory cell possesses at least one integrated structure such as defined above, the two MOS transistors of which respectively form the two pMOS transistors of the two inverters.

There is a risk of accidental bit flipping in the SRAM elementary cell, i.e. of the logic value of the datum stored in the SRAM memory in the flip-flop formed by the two inverters of this memory being inverted. In other words, if, at a given instant, a low logic level is present at the output of one of the inverters and a high logic level is present at the output of the other inverter, bit flipping results in the high logic level being replaced by the low logic level and vice versa, thereby leading to the stored datum being inverted.

These bit-flipping errors, also referred to by those skilled in the art as "soft errors", may be caused by interference created by particles such as alpha particles or even cosmic rays, or even by the memory device being attacked by a laser beam.

One solution currently used to suppress these bit-flipping errors consists in using error-correcting codes and in physically separating bits belonging to a given error correction group.

According to one embodiment, a totally different and simpler solution is provided for limiting the risk of accidental flipping of bits of the SRAM cell, this embodiment providing for the at least one integrated structure to be a structure possessing an additional contact pad making contact with the additional region, this additional contact pad being intended to be connected to a supply voltage or to ground.

Specifically, such a structure has a compact footprint since the first electrode of the capacitor is formed by the gate region of the transistor, thereby allowing, simply, a filtering capacitor to be formed within the SRAM cell, the capacitance of this capacitor not only being generally much higher than the capacitances of capacitors produced in the first metallization level of the integrated circuit, but also better controlled, this capacitor furthermore not coupling to interconnects located on top of the SRAM cell.

This filtering capacitor greatly increases the energy required to accidentally flip the flip-flop formed by the two inverters of the SRAM cell.

According to one embodiment, the processor comprises a row decoder and a column decoder that may advantageously comprise integrated structures such as defined above.

In this respect, the potential of the gate regions of the two transistors of the structure may vary between 0 volts and a maximum value, for example 16 volts, the additional contact pad then advantageously being intended to receive a potential equal to a value chosen to prevent breakdown of the second gate dielectric, for example equal to half the maximum value, here 8 volts.

According to another aspect, an integrated circuit is provided incorporating a memory device such as defined above.

According to yet another aspect, provision is made for a process for producing an integrated structure comprising a pair of neighboring MOS transistors.

This process comprises:

a) forming a first gate dielectric on top of a substrate;

b) forming a first layer of gate material on top of the first gate dielectric;

c) locally etching the first layer so as to form a rectangular slot in the first layer extending in a first direction between two ends;

d) forming a second gate dielectric on the etched first layer and on the sidewalls of the slot;

e) forming a second layer of gate material on the second gate dielectric; and f) etching the second layer of gate material, the second dielectric, the first layer of gate material and the first dielectric with a profile possessing a rectilinear portion overlapping the slot between its two ends and extending in a second direction substantially orthogonal to the first direction, so as to form for each of the two MOS transistors a controllable gate region separated from the substrate by the first gate dielectric and an additional region of gate material, the region being separated from the two gate regions by the second gate dielectric and possessing a continuous element located on top of a portion of the two gate regions and a branch united with a zone of the lower face of the element and extending between them and at distance from the two gate regions as far as the first gate dielectric.

According to one embodiment, the process comprises, after step f), a step of locally etching the etched second layer of gate material and the etched second dielectric so as to make each gate region of the continuous element protrude from the additional region, and a step of forming electrically conductive contact pads on the two protruding portions of the two gate regions.

BRIEF DESCRIPTION OF THE DRAWINGS

Other advantages and features of the invention will become apparent on examining in detail completely non-limiting implementations and embodiments thereof, and the appended drawings in which.

DETAILED DESCRIPTION OF ILLUSTRATIVE EMBODIMENTS

Figure 1:
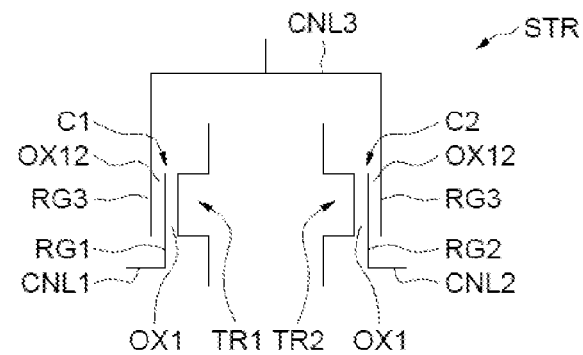
FIGS. 1 to 15 schematically illustrate various implementations and embodiments of the invention.

In FIG. 1, the reference STR designates the equivalent circuit of an integrated structure, one embodiment of which in an integrated circuit is schematically illustrated in FIGS. 2 to 5.

Figure 2:
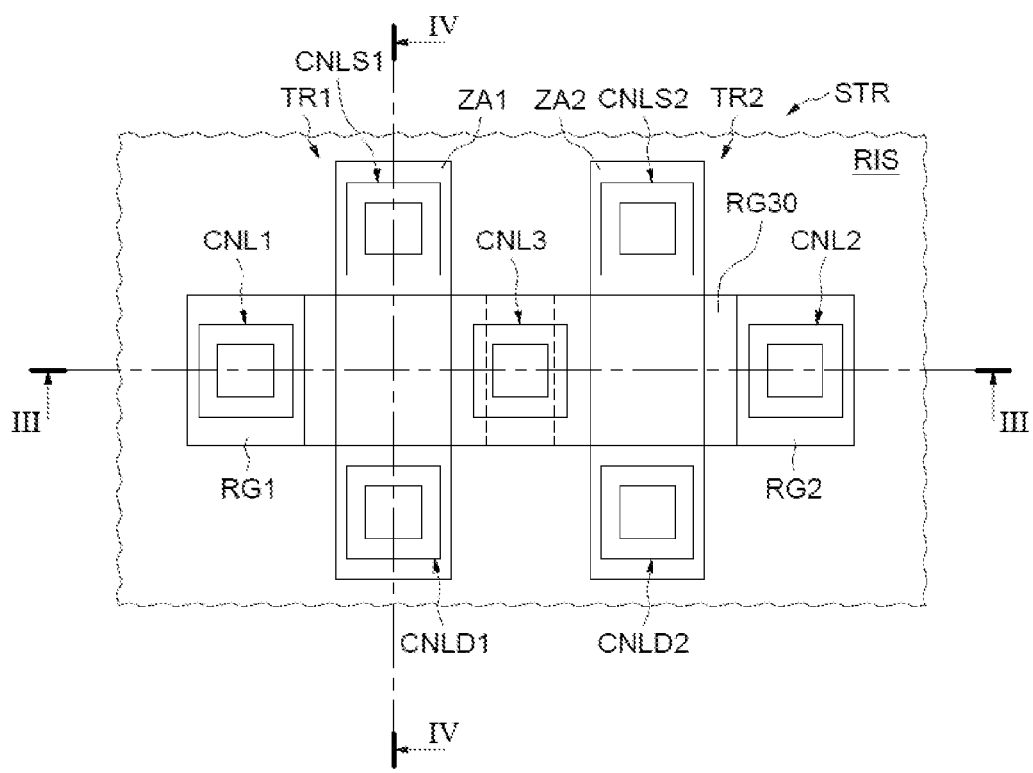
Figure 3:
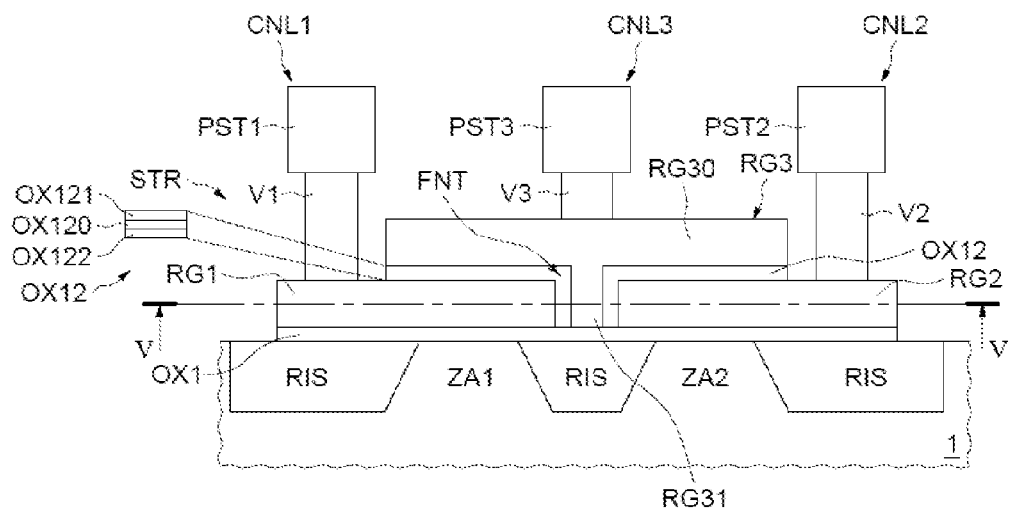
Figure 4:
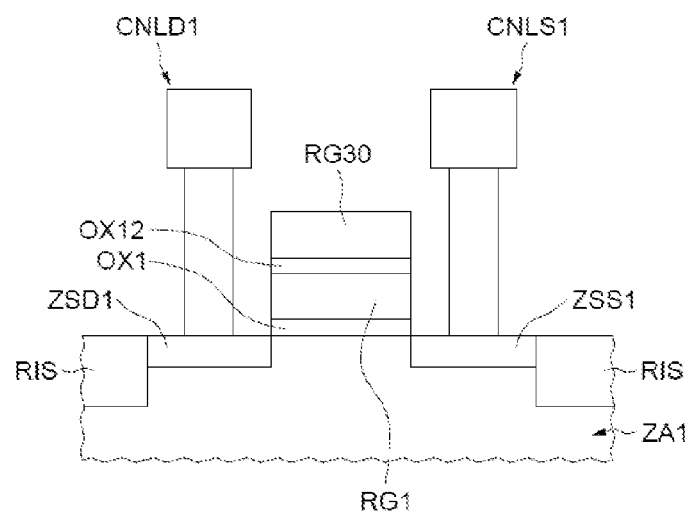
Figure 5:
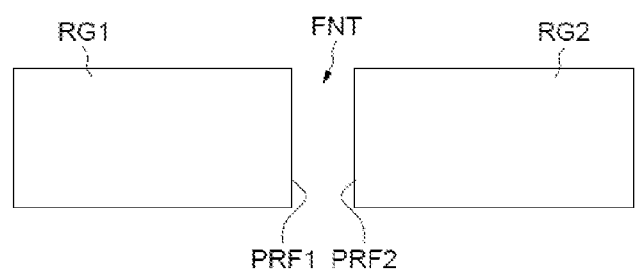
Figure 6:
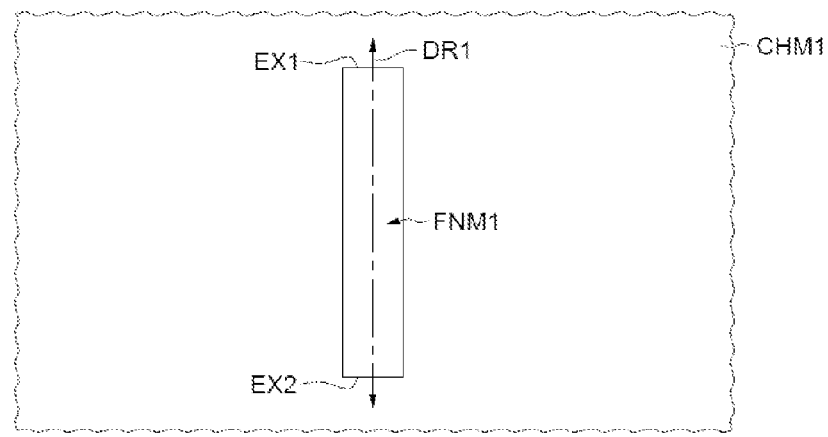
Figure 7:
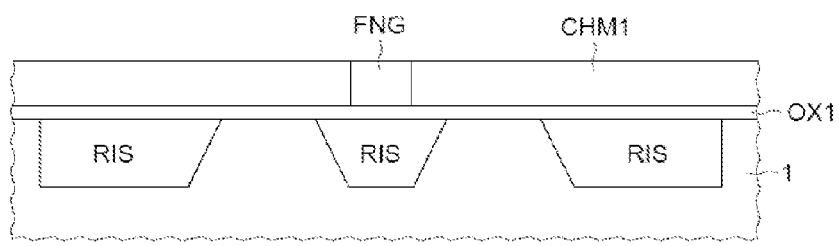

In this respect, FIG. 3 is a cross section along the line III-III in FIG. 2, FIG. 4 is a cross section along the line IV-IV in FIG. 2 and FIG. 5 is a partial cross section along the line V-V in FIG. 3.

With reference to FIGS. 1 to 5, it may be seen that the integrated structure STR here comprises a pair of MOS transistors TR1, TR2. Each transistor TR1, TR2 comprises a gate region RG1, RG2 separated from an underlying substrate 1 by a first gate dielectric OX1 for example comprising silicon dioxide.

Located in the semiconductor substrate 1, which is for example made of silicon, are located the active zones ZA1 and ZA2 of the two transistors TR1 and TR2, which zones are bounded, in the conventional way, by isolating regions RIS, STIs (shallow trench isolations) for example.

The structure STR moreover comprises an additional region RG3 comprising a gate material that may, just like the gate regions RG1, contain polysilicon.

This additional region RG3 is separated from the two gate regions by a second gate dielectric OX12 that, as illustrated in FIG. 3, may advantageously comprise a stack formed of a layer OX120 of silicon nitride $Si_3N_4$ sandwiched between two layers OX121 and OX122 of silicon dioxide $SiO_2$.

The additional region RG3 possesses a continuous element RG30 located on top of a portion of the two gate regions RG1 and a branch RG31 united with a zone of the lower face of the element RG30 and extending between them and at distance from the two gate regions RG1 as far as the first gate dielectric OX1.

Here, the gate regions RG1, RG2 project beyond the continuous element RG30, thereby are providing a simple way of applying a control potential or voltage to control these gate regions.

In this respect, the structure STR for example comprises, on either side of the additional region RG3, two electrically conductive contact pads CNL1, CNL2 making contact with the two gate regions RG1, RG2, respectively. These contact pads, bearing against the projecting portions of the gate regions, allow the two gate regions RG1 and RG2 to be biased and here comprise contacts V1, V2 and metal track portions PST1, PST2 that here are located in the first metallization level of the integrated circuit.

The structure STR also furthermore comprises, in this embodiment, an additional electrically conductive contact pad CNL3 making contact with the additional region RG3 and allowing, here again, this additional region RG3 to be optionally biased with a potential that may be the supply voltage or ground.

This being so, this additional contact pad could be left floating. As a variant, the contact pad CNL3 could even optionally be omitted if the additional region RG3 were in fact to be left floating.

Here again, the contact pad CNL3 comprises a contact V3 and a metal track PST3 that here is also located in the first metallization level of the integrated circuit.

It may therefore be seen, especially in FIGS. 1 and 3, that the additional region RG3, the two gate regions RG1 and RG2 and the second gate dielectric OX12 form two capacitors C1 and C2 that are connected in parallel to the gates of the transistors TR1 and TR2. The first electrode of a capacitor is formed by the corresponding gate region of the transistor and the second electrode of each capacitor is formed by the additional region RG3.

The contact pads CNL1, CNL2 and CNL3 allow different biases to be applied to the electrodes of the two capacitors.

In FIG. 4, the zones ZSS1 and ZSD1 designate the source and drain zones of the transistor TR1, respectively. Contact pads CNLS1, CNLS2, CNLD1 and CNLD2 allow the source and drain zones of the two transistors TR1 and TR2 to be biased.

It may be seen, especially in FIG. 5 (in which the branch RG31 has not been shown for the sake of simplicity) that, in this embodiment, the two gate regions RG1 and RG2 are aligned and separated by a slot FNT. Moreover, the orthogonal projections onto the substrate of the two profiles PRF1 and PRF2 of the two facing gate regions are free from rounded portions and have square edges.

Reference is now more particularly made to FIGS. 6 to 9 to describe one implementation of a process for producing such an integrated structure STR in a semiconductor wafer.

After isolation zones RIS have been formed in the substrate 1 of the wafer in a conventional way, the first gate dielectric OX1 is formed over all of the semiconductor wafer in a conventional way known per se. Next, again on the wafer scale, a first layer CHM1 of gate material, for example of polysilicon, is formed on top of the first gate dielectric OX1.

Next, the first layer CHM1 is etched locally using a conventional photolithography step employing a mask containing a rectangular slot FNM1 extending in a first direction DR1 between two ends EX1 and EX2, so as to form in this first layer CHM1 a rectangular slot FNG corresponding to the slot FNM1.

Next, as illustrated in FIG. 8, again on the wafer scale, the second gate dielectric OX12 is formed on the etched first layer and on the sidewalls of the slot FNG.

Figure 8:
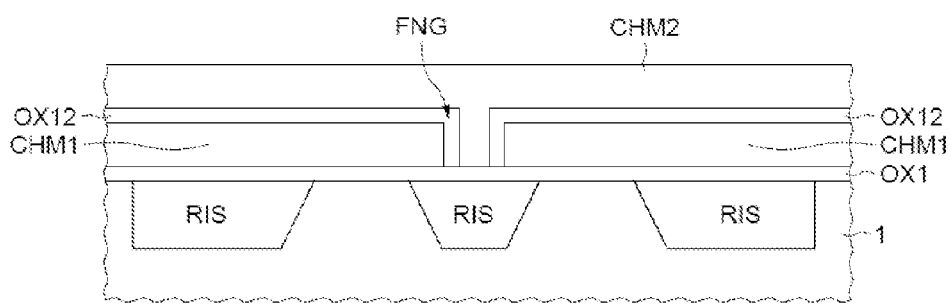

Next, again on the wafer scale, a second layer CHM2 of gate material is formed on the second gate dielectric OX12, the second layer CHM2 especially, as illustrated in FIG. 8, filling the rest of the slot FNG between the gate dielectric OX12.

Figure 9:
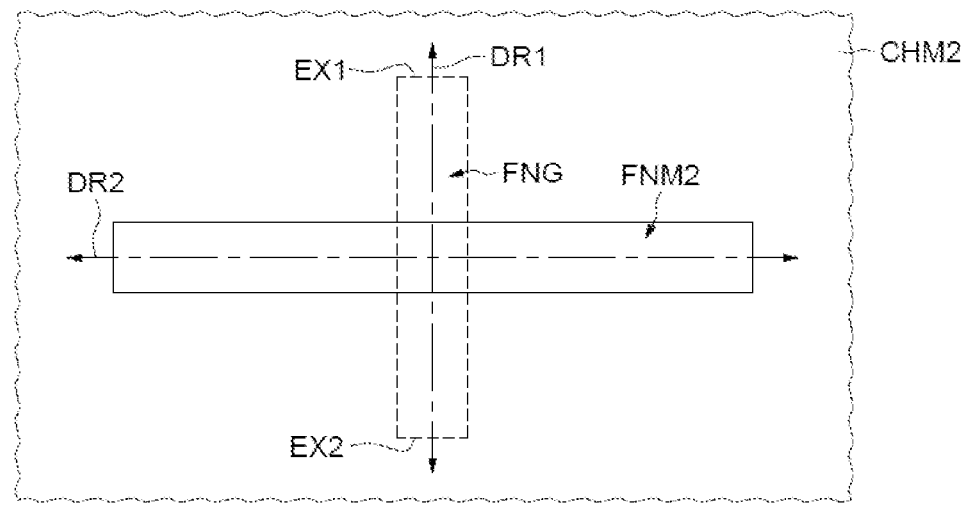

Next, as illustrated in FIG. 9, the second layer CHM2 of gate material, the second dielectric OX12, the first layer CHM1 of gate material and the first dielectric OX1 are etched with a profile FNM2 possessing a rectilinear portion overlapping the slot FNG between its two ends EX1, EX2, this rectilinear, here rectangular, portion extending in a second direction DR2 substantially orthogonal to the first direction.

The double-level gate structure illustrated in FIGS. 2 to 5 is thus obtained (after the ends of the region RG3 and of the second gate dielectric OX12 have been etched locally to allow contact to be made to contact pads CNL1 and CNL2).

The fact that two orthogonal geometries FNG and FNM2 were used when etching the layers CHM1 and CHM2 has made it possible to prevent rounding of the facing profiles of the two gate regions, as illustrated in FIG. 5. Moreover, the first mask, comprising the slot FNM1 is associated with a narrower lithography than that associated with the mask comprising the profile FNM2. As a result, the gap between the two transistors is substantially decreased. Thus, a decrease of more than 50% may be obtained in the space between the active regions of the two transistors.

Reference is now more particularly made to FIGS. 10 to 15 to illustrate an example application of such an integrated structure in a memory device DIS incorporated in an integrated circuit CI.

Figure 10:
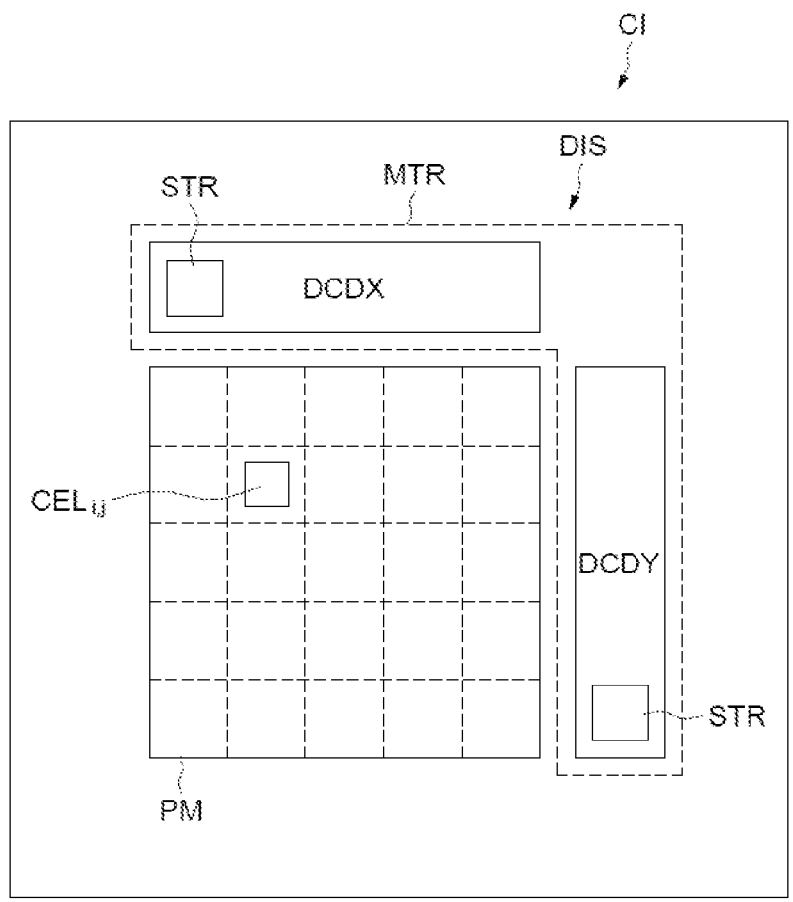

As schematically illustrated in FIG. 10, the memory device DIS may in practice comprise a memory plane PM comprising a matrix of cells CELij organized into rows and columns, the plane being associated, in the conventional way, with a processor (MTR) configured to manage the memory plane PM and especially comprising a column decoder DCDX and a row decoder DCDY.

The row decoders and column decoders may comprise integrated structures STR such as described above, thereby saving space.

Such structures STR may also be incorporated into the memory cells $CEL_{i,j}$ of the device DIS, as will now be described with reference to FIGS. 11 to 15.

Figure 11:
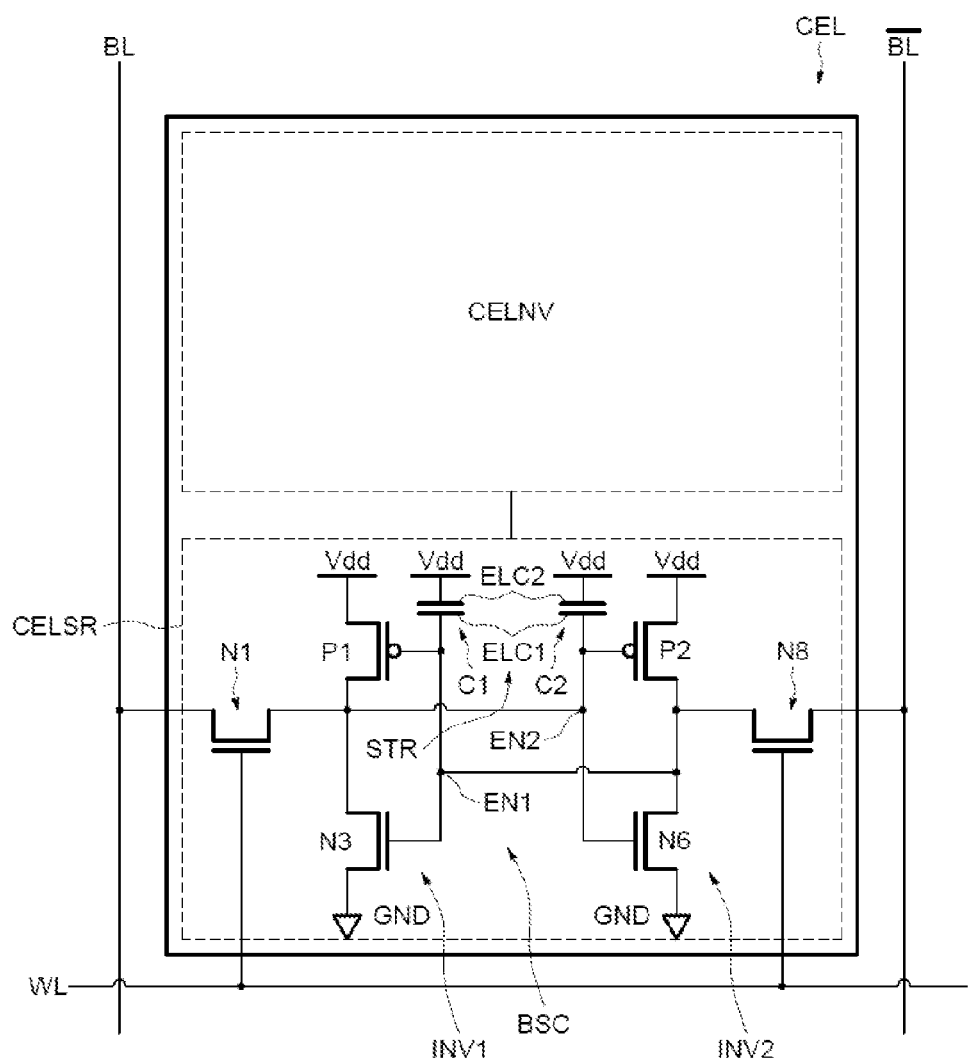

In FIG. 11, the reference CEL designates a memory cell of a memory plane, comprising an SRAM elementary memory cell CELSR and at least one nonvolatile elementary memory cell CELNV, these two elementary memory cells being coupled together.

The elementary memory cell CELSR has a conventional structure and comprises a flip-flop BSC formed from two cross-connected CMOS inverters, and two access transistors N1 and N8.

The two inverters INV1, INV2 are connected between a supply terminal, which is intended to be connected to the supply voltage Vdd, and ground GND.

The two access transistors N1 and N8 are respectively connected between the outputs of the two inverters and two bit lines BL and $\overline{BL}$, $\overline{BL}$ designating the complementary bit line of the line BL.

The gates of the access transistors N1 and N8 are connected to a word line WL.

The operations for reading and writing a datum to the elementary memory cell CELSR are conventional operations known per se.

When the power is cut or on an external signal, the datum contained in the elementary memory cell CELSR is transferred and stored in the nonvolatile elementary memory cell CELNV. This is what is referred to as a "nonvolatile transfer". Next, when power returns, the elementary memory cell CELSR is reloaded with the content of the nonvolatile elementary memory cell CELNV.

Furthermore, depending on the configurations chosen during this operation for reloading the cell CELSR, the datum may or may not be inverted relative to that initially stored in the memory cell CELSR before the nonvolatile transfer to the nonvolatile elementary memory cell CELNV.

The elementary memory cell CELSR of the cell in Figure ii is configured to lower the risk of accidental flipping of logic states present at the output nodes of the two inverters, for example when hit by cosmic rays or even during a laser-beam attack.

In this respect, the cell CELSR comprises a structure STR of the type of those illustrated in FIGS. 1 to 5 and forming the two pMOS transistors P1 and P2 of the two inverters INV1 and INV2.

Moreover, whereas, as indicated above, the first electrodes ELC1 of these two capacitors C1 and C2 are formed by the gates of the transistors P1 and P2, respectively, the second electrodes ELC2 of these two capacitors C1 and C2 are here connected to the sources of these two transistors P1 and P2, and therefore to the supply voltage Vdd.

Figure 12:
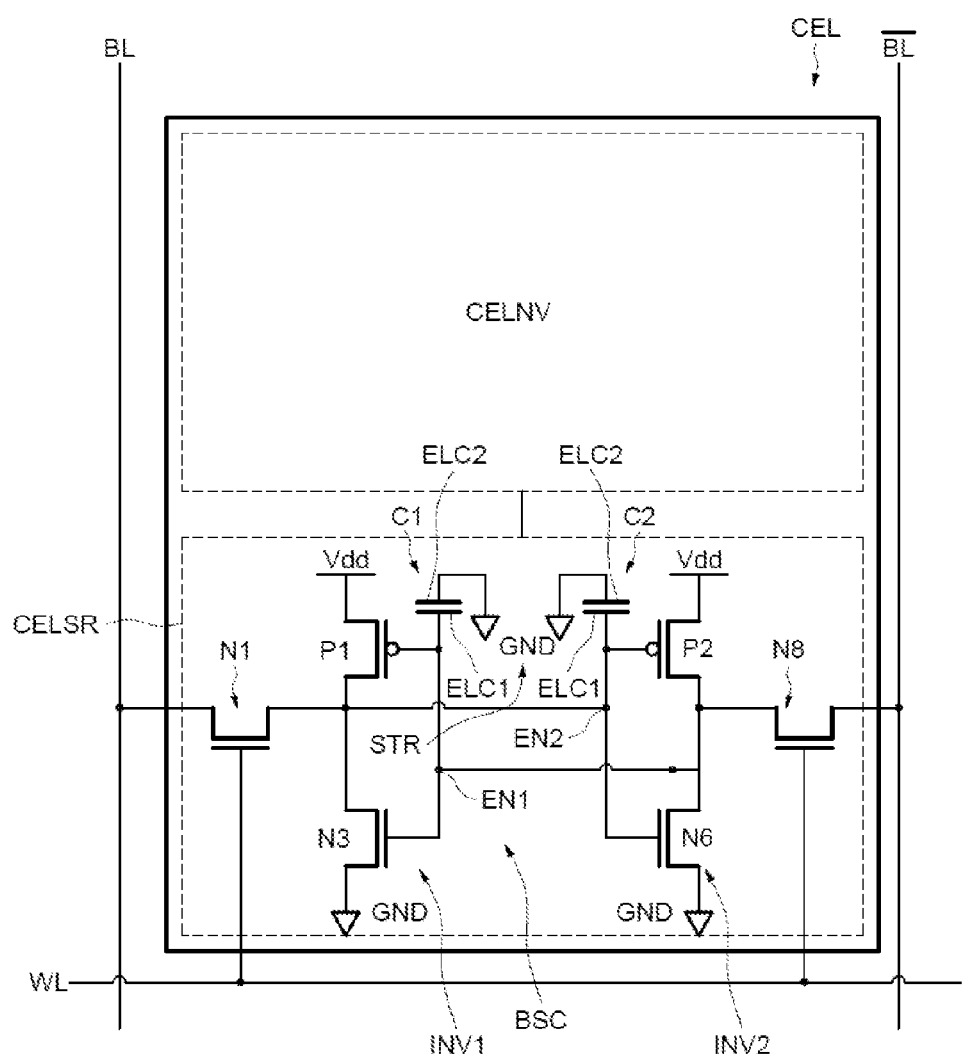

As a variant, it would be possible, as illustrated in FIG. 12, to connect the two electrodes ELC2 of the two capacitors C1 and C2 to ground GND.

These two capacitors C1 and C2 allow the total capacitance of the flip-flop BSC to be increased, thereby increasing the energy required to accidentally flip the flip-flop BSC.

The thickness of the first gate dielectric OX1 (FIG. 3) is typically comprised between 20 Å and 250 Å whereas the thickness of the second gate dielectric OX12 is typically comprised between 100 Å and 200 Å. The fact that the dielectric OX12 consists of an $SiO_2/Si_3N_4/SiO_2$ sandwich allows a well-controlled capacitance to be obtained.

It should be noted that using a structure STR to produce the pMOS transistors of the inverters saves space and that the region RG3 is either left floating or connected to a potential.

It would also have been possible to produce the two nMOS transistors M3 and M6 of the two inverters using another structure STR. This being so, given that these two transistors M3 and M6 are offset in the layout, it was preferable, for the sake of simplicity of implementation, not to use a structure STR for these nMOS transistors.

The invention is applicable to any type of nonvolatile memory cell comprising one or more floating-gate transistors, such as EEPROM cells for example.

Figure 13:
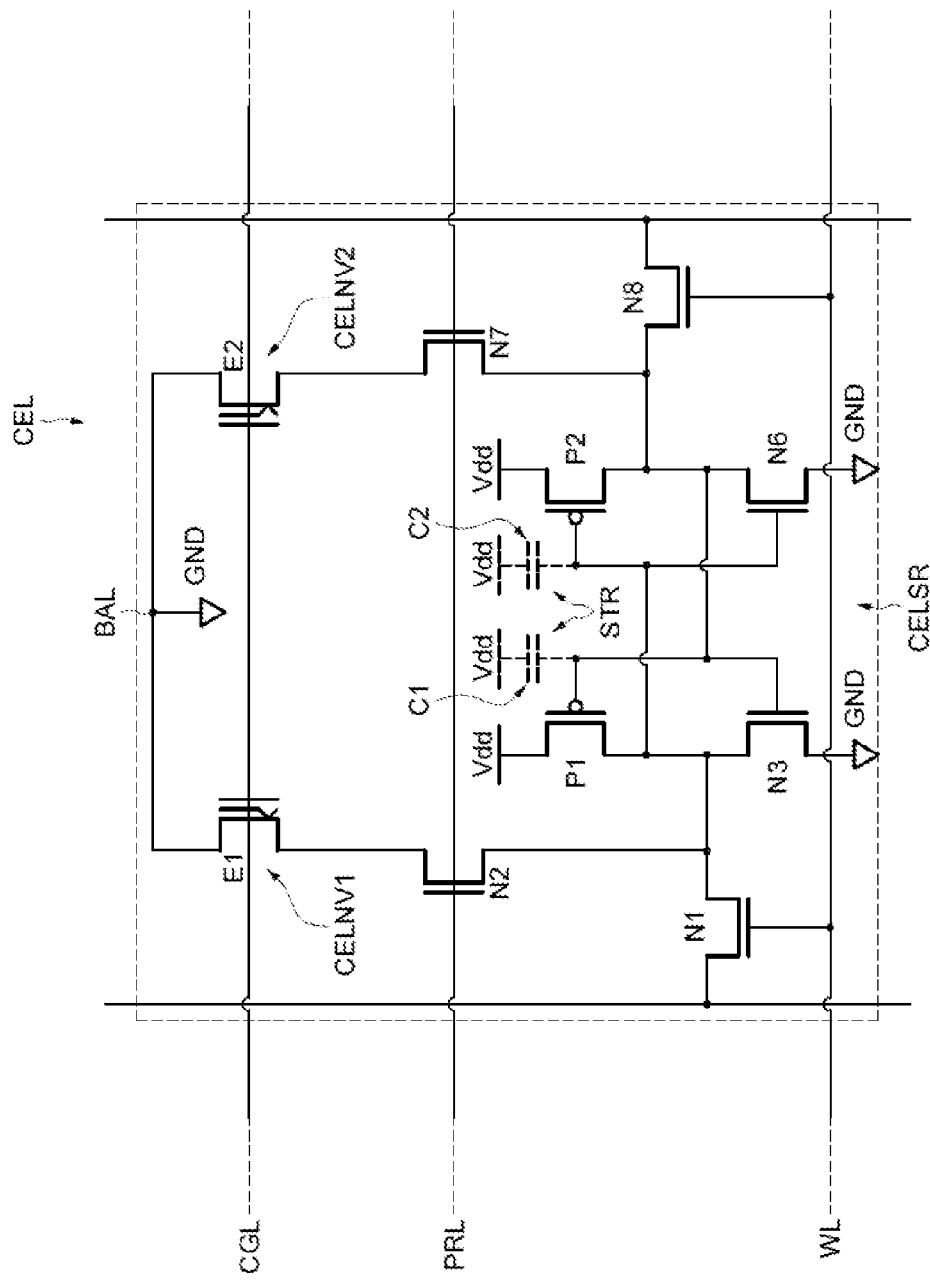

FIG. 13 illustrates one embodiment of a memory cell CEL comprising the SRAM elementary memory cell CELSR and two nonvolatile EEPROM elementary cells CELNV1 and CELNV2 here comprising two floating-gate transistors E1 and E2.

Such a cell has been described in the French patent application numbered 1356720. Certain of its features will now be recalled.

The nonvolatile EEPROM cells of the cell CEL are conventional cells, i.e. in which the selection transistor has been removed and having a tunnel injection zone between their floating gate and drain.

The sources of these two transistors E1 and E2 are connected to a supply terminal BAL that here is connected to ground.

As for the control electrodes of the two floating-gate transistors E1 and E2, they are connected to a first control line CGL.

The drains of the two floating-gate transistors E1 and E2 are connected to the inputs and outputs of two inverters of the cell CELSR by an interconnect stage that here comprises two nMOS interconnect transistors, reference N2 and N7.

More precisely, the two interconnect transistors N2 and N7 are connected between the drains of the two floating-gate transistors E1 and E2 and the two outputs of the two inverters P1, N3 and P2, N6, respectively. Moreover, the control electrodes (gates) of these two interconnect transistors N2 and N7 are connected to a second control line PRL.

During an operation of writing to the elementary memory cell CELSR, this being a conventional write operation, the control line PRL is grounded, turning off the interconnect stage. Likewise, the first control line CGL is also grounded.

As is well known by those skilled in the art, a nonvolatile transfer or write operation is made up of an erase cycle followed by a differential programming cycle as two nonvolatile elementary memory cells are present.

For the erase cycle, the line PRL is grounded, turning off the interconnect transistors N2 and N7. Next, an erase voltage is delivered via the first control line CGL.

During the differential programming cycle, the second control line PRL passes to the supply voltage, turning on the transistors N2 and N7. A programming voltage is then delivered via the first control line CGL.

To reload the cell CELSR, the first control line CGL passes to a reference read voltage, typically 1 volt, while the second control line PRL is at a voltage of 2 volts, for example so as to turn on the transistors N2 and N7.

Figure 14:
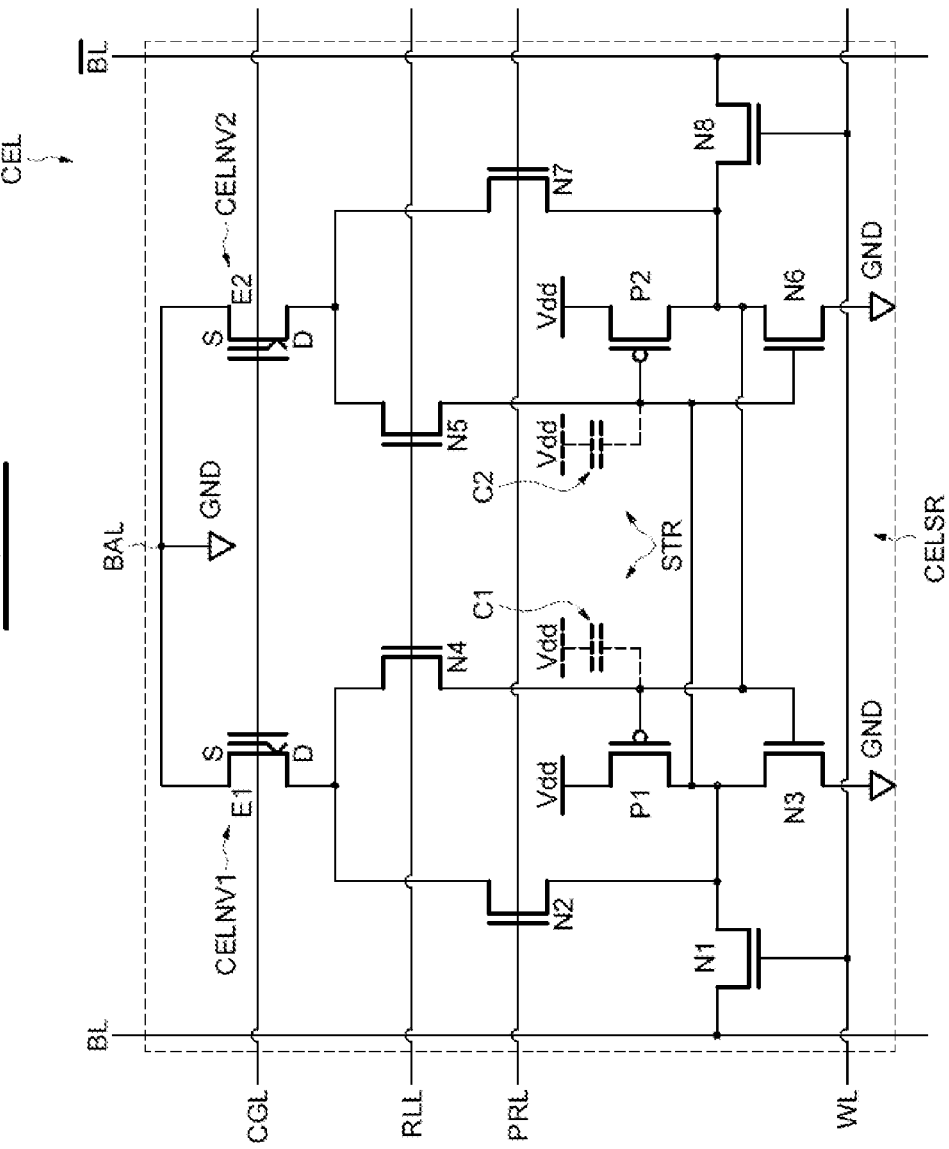

FIG. 14 illustrates another embodiment of a memory cell CEL, here again incorporating two nonvolatile EEPROM memory cells CELNV1 and CELNV2 here comprising two floating-gate transistors E1 and E2.

Such a cell has been described in the patent application numbered 1355439. Certain of its features will now be recalled.

Here again, the nonvolatile EEPROM cells of the CEL cell are conventional cells, that is to say in which the selection transistor has been removed and having a tunnel injection zone between their floating gate and drain.

The sources of these two transistors E1 and E2 are connected to a supply terminal BAL that here is connected to ground.

As for the control electrodes of the two floating-gate transistors E1 and E2, they are connected to a first control line CGL.

The drains of the two floating-gate transistors E1 and E2 are connected to the inputs and outputs of the two inverters by an interconnect stage that here comprises two first nMOS interconnect transistors, reference N2 and N7, and two second nMOS interconnect transistors, reference N4 and N5.

More precisely, the two first interconnect transistors N2 and N7 are connected between the drains of the two floating-gate transistors E1 and E2 and the two outputs of the two inverters P1, N3 and P2, N6, respectively. Moreover, the control electrodes (gates) of these two interconnect transistors N2 and N7 are connected to a second control line PRL.

As for the two second interconnect transistors N4 and N5, they are connected between the drains of the two floating-gate transistors E1 and E2 and the two inputs of the two inverters P1, N3 and P2, N6, respectively.

The control electrodes of these two second interconnect transistors N4 and N5 are connected to a third control line RLL.

Although the two second interconnect transistors N4 and N5 are not essential, they are particularly advantageous as they make it possible to prevent data being inverted when the contents of the two nonvolatile cells E1 and E2 are reloaded into the SRAM elementary memory cell CELSR, even when the supply terminal BAL is grounded.

The operation used to write to the elementary memory cell CELSR is a conventional write operation.

Thus, the control lines PRL, RLL are grounded, turning off the interconnect stage. Likewise, the first control line CGL is also grounded.

The operation used to read a datum from the cell CELSR is also a conventional read operation.

For the erase cycle, the lines PRL and PLL are grounded, turning off the interconnect transistors N2, N4, N5 and N7. Next, an erase voltage is delivered via the first control line CGL.

For the differential programming cycle, the second control line PRL passes to the supply voltage Vdd while the third control line RLL remains grounded.

Therefore, the interconnect transistors N2 and N7 are turned on while the interconnect transistors N4 and N5 are turned off.

A programming voltage is then delivered via the first control line CGL.

The floating-gate transistors E1 and E2 are all turned off during this differential programming operation.

In order to reload the cell CELSR, the first control line CGL passes to a reference read voltage, typically 1 volt, while the second control line PRL is grounded and the third control line RLL is at a voltage of 2 volts, for example, so as to turn on the transistors N4 and N5 while the transistors N2 and N7 are turned off.

The voltage on the word line WL is zero.

Figure 15:
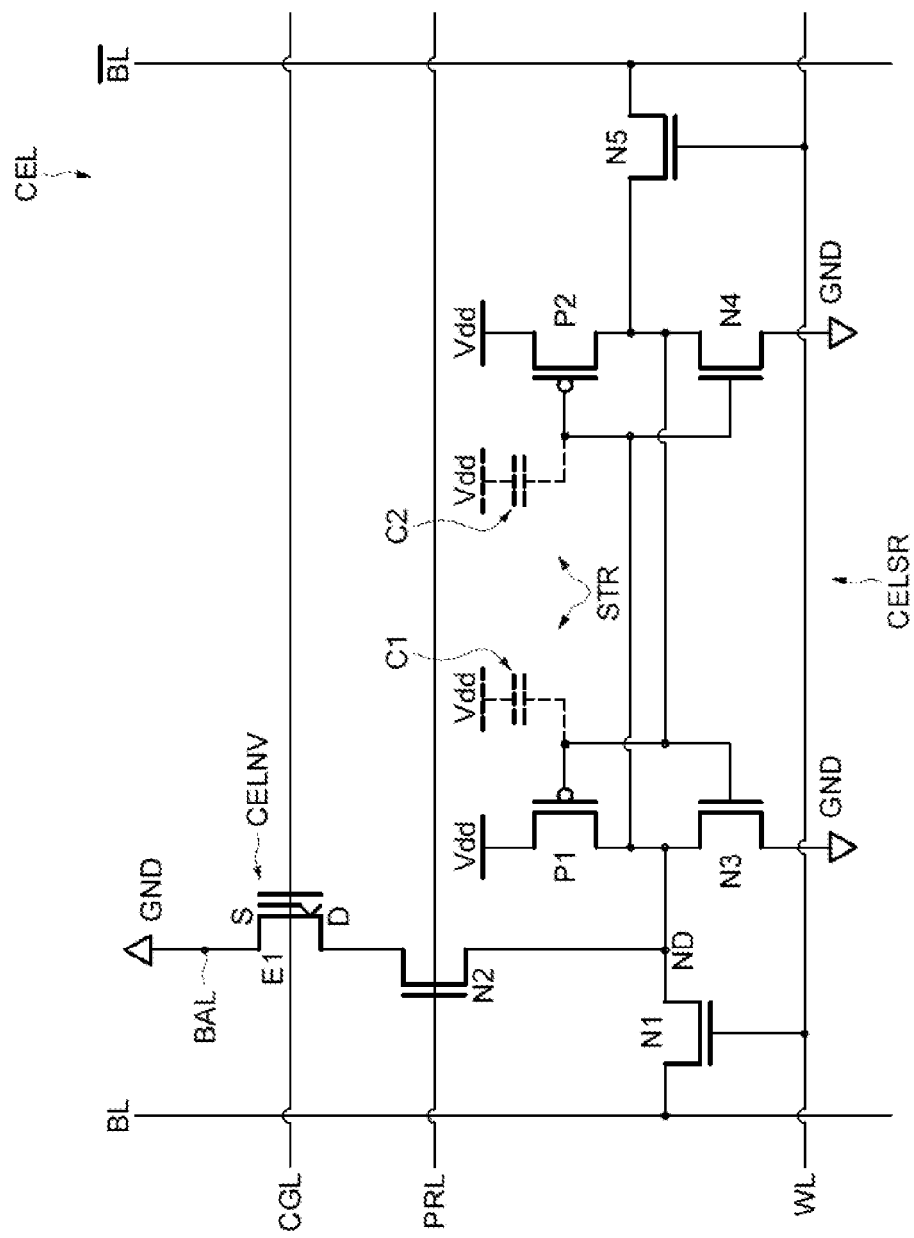

FIG. 15 illustrates yet another embodiment of a memory cell CEL.

Such a cell has been described in the aforementioned French patent application numbered 1355440.

Certain of its features will now be recalled.

This memory cell CEL comprises a single nonvolatile EEPROM elementary cell CELNV here comprising a controllable floating-gate transistor E1 that is turned off during an operation for programming a datum stored in the SRAM elementary memory cell into the nonvolatile elementary memory cell.

Here again, the nonvolatile EEPROM cell of the cell CEL is a conventional cell, that is to say in which the selection transistor has been removed and having a tunnel injection zone between its floating gate and drain.

The source of the transistor E1 is connected to a supply terminal BAL that here is grounded.

As for the control electrode of the floating-gate transistor E1, it is connected to a first control line CGL.

The drain of the floating-gate transistor E1 is here connected to the output (node ND) of the first inverter P1, N3 of the elementary memory cell CELSR by way of an interconnect stage, here comprising a first interconnect transistor N2. This single interconnect transistor N2 is here an nMOS transistor.

The control electrode (gate) of this first interconnect transistor N2 is connected to a second control line PRL. Therefore, the interconnect stage is controlled by a signal originating from outside the memory cell CEL, i.e. by the control voltage present on the second control line PRL.

The operation used to write to the elementary memory cell CELSR is here again a conventional write operation.

Thus, the control line PRL is grounded, turning off the interconnect stage. Likewise, the first control line CGL is also grounded.

For the erase cycle, the line PRL is grounded, turning off the interconnect transistor N2. Next, an erase voltage is delivered via the first control line CGL.

In the programming cycle, the second control line PRL passes to the supply voltage Vdd.

Therefore, the interconnect transistor N2 is turned on.

A programming voltage is then delivered via the first control line CGL.

Before it is reloaded, the SRAM elementary memory cell CELSR is initialized (or reset) so as to initialize it to a known state and to prevent it from entering into a metastable state.

This initialisation may for example be obtained by writing a "1" to the SRAM cell using the conventional write procedure.

For the reloading operation, the first control line CGL passes to a reference read voltage, typically 1 volt, while the second control line PRL is at a voltage of 2 volts, for example so as to turn on the interconnect transistor N2.

The voltage on the word line WL is zero.

What is claimed is:

1. A method of making a semiconductor device, the method comprising:
    forming a first gate dielectric over a substrate;
    forming a first layer of gate material over the first gate dielectric;
    forming a first gate region and a second gate region by etching the first layer so as to form a slot in the first layer extending in a first direction between two ends;
    forming a second gate dielectric over the etched first layer and on sidewalls of the slot;
    forming a second layer of the gate material over the second gate dielectric;
    forming a continuous element extending along a second direction by patterning the second layer of the gate material, the second gate dielectric, the first layer of gate material and the first gate dielectric, the second direction being substantially orthogonal to the first direction; and
    forming electrically conductive contact pads for contacting the first, the second gate regions and the continuous element.

2. The method according to claim 1, wherein the first gate region forms a controllable gate of a first MOS transistor and the second gate region forms a controllable gate of a second MOS transistor, the controllable gates overlying the first gate dielectric.

3. The method according to claim 1, wherein forming a second layer of the gate material comprises forming a branch extending downward from the continuous element toward the substrate as far as the first gate dielectric, wherein the branch is located between the first and second gate regions and spaced from both first and second gate regions.

4. The method according to claim 1, further comprising:
    etching end portions of the continuous element and an underlying portion of the second gate dielectric so as to expose a portion of each of the first and the second gate regions, wherein the electrically conductive contact pads are formed on the exposed portions of the first and second gate regions.

5. A method of making a semiconductor device, the method comprising:
    forming a first gate dielectric over a substrate;
    forming a first controllable gate region and a second controllable gate region over the first gate dielectric, the first controllable gate region and the first gate dielectric forming a part of a first MOS transistor of an SRAM elementary cell, the second controllable gate region and the first gate dielectric forming a part of a second MOS transistor of the SRAM elementary cell;
    forming a second gate dielectric over the first controllable gate region and the second controllable gate region;
    forming a common conductive region overlying the first and second gate regions and separated therefrom by the second gate dielectric, the common conductive region being part of the SRAM elementary cell, the common conductive region comprising a continuous element located over a portion of the first and second controllable gate regions and a branch extending downward from the continuous element toward the substrate as far as the first gate dielectric, the branch located between the first and second controllable gate regions and spaced from both the first and second controllable gate regions, wherein the first controllable gate region laterally extends beyond the continuous element of the common conductive region, wherein the second controllable gate region laterally extends beyond the continuous element of the common conductive region;
    forming a first contact pad in the first controllable gate region for coupling to a first metal track portion disposed over the first controllable gate region; and
    forming a second contact pad in the second controllable gate region for coupling to a second metal track portion disposed over the second controllable gate region.

6. The method of claim 5, wherein the first and second gate controllable regions are aligned.

7. The method of claim 5, wherein orthogonal projections onto the substrate of two facing profiles of the first and second controllable gate regions are free from rounded portions.

8. The method of claim 5, wherein forming the second gate dielectric comprises forming a silicon nitride layer sandwiched between two silicon dioxide layers.

9. The method of claim 5, further comprising:
    forming a first electrically conductive contact electrically contacting the first contact pad; and
    forming a second electrically conductive contact electrically contacting the second contact pad, the common conductive region located between the first and second electrically conductive contacts.

10. The method of claim 5, further comprising:
    forming an additional electrically conductive contact in electrical contact with the common conductive region.

11. A method of making a semiconductor device, the method comprising:
    forming a plurality of memory cells arranged in rows and columns, wherein forming each memory cell comprises forming an SRAM elementary memory cell and a floating-gate transistor cell coupled together; and
    wherein forming the SRAM elementary memory cell comprises:
        forming a first source/drain region and a second source/drain region in a substrate and a first gate dielectric over the substrate,
        forming a first controllable gate region overlying the first gate dielectric and the first source/drain region, wherein the first controllable gate region, the first gate dielectric, and the first source/drain region are part of a first MOS transistor,
        forming a second controllable gate region overlying the first gate dielectric and a second source/drain region, wherein the second controllable gate region, the first gate dielectric, and the second source/drain region are part of a second MOS transistor, wherein the first controllable gate region is coupled to the second source/drain region and the second controllable gate region is coupled to the first source/drain region,
        forming a second gate dielectric over the first and the second controllable gate regions,
        forming a common conductive region overlying the first and the second controllable gate regions and capacitively coupled to the first and the second controllable gate regions through the second gate dielectric, the common conductive region comprising a continuous element located over a portion of the first and the second controllable gate regions and a branch extending downward from the continuous element as far as the first gate dielectric; and
        forming a first electrically conductive contact pad electrically contacting the first controllable gate region, and a second electrically conductive contact pad electrically contacting the second controllable gate region.

12. The method according to claim 11, wherein the branch is located between the first and second gate controllable regions and spaced from both the first and second controllable gate regions.

13. The method according to claim 11, wherein forming the SRAM elementary memory cell comprises forming two cross-coupled inverters comprising two pMOS transistors, wherein the first and second MOS transistors are the two pMOS transistors of the cross-coupled inverters.

14. The method according to claim 11, wherein forming the common conductive region comprises exposing a portion of the first and the second controllable gate regions laterally beyond the continuous element of the common conductive region.

15. The method according to claim 11, further comprising forming a third electrically conductive contact pad electrical contacting the common conductive region, wherein the common conductive region is located between the first and second electrically conductive contact pads.

16. The method of claim 11, wherein forming the second gate dielectric comprises forming a silicon nitride layer sandwiched between two silicon dioxide layers.

17. The method according to claim 1, wherein forming the electrically conductive contact pads comprises forming a first via contacting a portion of an outer surface of the first gate region, a second via contacting a portion of an outer surface of the second gate region, and a third via contacting a portion of an outer surface of the continuous element.

18. The method according to claim 17, wherein the third via is spaced substantially equidistant from the first via and the second via.

19. The method according to claim 1, further comprising:
forming a first source region and a first drain region, the first source region and the first drain region are formed on opposite sides of the first gate region; and
forming a second source region and a second drain region, the second source region and the second drain region are formed on opposite sides of the second gate region.

20. The method according to claim 19, further comprising:
forming a first source contact to the first source region and a first drain contact to the first drain region; and
forming a second source contact to the second source region and a second drain contact to the second drain region.

21. The method according to claim 11, wherein forming the SRAM elementary memory cell comprises forming two cross-coupled inverters comprising two nMOS transistors, wherein the first and second MOS transistors are the two nMOS transistors of the cross-coupled inverters.

22. The method according to claim 11, wherein forming the first and the second electrically conductive contact pads comprises forming a first via contacting a portion of an outer surface of the first controllable gate region, a second via contacting a portion of an outer surface of the second controllable gate region, and a third via contacting a portion of an outer surface of the common conductive region.

23. The method according to claim 22, wherein the third via is spaced substantially equidistant from the first via and the second via.

24. The method according to claim 11, further comprising:
forming a first source region and a first drain region, the first source region and the first drain region are formed on opposite sides of the first controllable gate region;
forming a second source region and a second drain region, the second source region and the second drain region are formed on opposite sides of the second controllable gate region;
forming a first source contact to the first source region and a first drain contact to the first drain region; and
forming a second source contact to the second source region and a second drain contact to the second drain region.

* * * * *